(12) United States Patent
Jacobs et al.

(10) Patent No.: US 7,652,746 B2
(45) Date of Patent: Jan. 26, 2010

(54) LITHOGRAPHIC APPARATUS AND DEVICE MANUFACTURING METHOD

(75) Inventors: Johannes Henricus Wilhelmus Jacobs, Eindhoven (NL); Nicolaas Ten Kate, Almkerk (NL); Franciscus Johannes Joseph Janssen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 660 days.

(21) Appl. No.: 11/319,217

(22) Filed: Dec. 28, 2005

(65) Prior Publication Data

US 2006/0285096 A1    Dec. 21, 2006

Related U.S. Application Data

(60) Provisional application No. 60/692,234, filed on Jun. 21, 2005.

(51) Int. Cl.
- *G03B 27/52* (2006.01)
- *G03B 27/42* (2006.01)
- *G03B 27/72* (2006.01)
- *G03B 27/32* (2006.01)

(52) U.S. Cl. .............. 355/30; 355/53; 355/72; 355/77

(58) Field of Classification Search .......... 355/30, 355/53, 72, 77
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ........................ 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi .................... 355/53 |
| 5,825,043 A | 10/1998 | Suwa .......................... 250/548 |
| 5,900,354 A | 5/1999 | Batchelder .................. 430/395 |
| 6,191,429 B1 | 2/2001 | Suwa .......................... 250/548 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Alan A Mathews
(74) *Attorney, Agent, or Firm*—Pillsbury Winthrop Shaw Pittman LLP (57) ABSTRACT

Methods and apparatus for maintaining the thermal equilibrium of a substrate and an immersion lithographic apparatus are disclosed using or having a timetable comprising information regarding the position, speed and/or acceleration of the substrate; and an evaporation controller and/or condensation controller acting to decrease localized evaporation and/or increase localized condensation in response to the information in the timetable. Evaporation of liquid from the surface of the substrate cools it down, while condensing liquid on its bottom surface heats the substrate locally.

50 Claims, 6 Drawing Sheets

U.S. PATENT DOCUMENTS

| | | | |
|---|---|---|---|
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 7,304,715 B2 * | 12/2007 | Cadee et al. | 355/30 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | |
| 2004/0211920 A1 | 10/2004 | Derksen et al. | 250/492.1 |
| 2004/0239954 A1 | 12/2004 | Bischoff | 356/635 |
| 2004/0257544 A1 | 12/2004 | Vogel et al. | 355/30 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0068499 A1 | 3/2005 | Dodoc et al. | 353/10 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2006/0033892 A1 | 2/2006 | Cadee et al. | 355/30 |
| 2006/0033898 A1 | 2/2006 | Cadee et al. | 355/53 |
| 2006/0102849 A1 | 5/2006 | Mertens et al. | 250/440.11 |
| 2006/0158627 A1 * | 7/2006 | Kemper et al. | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| EP | 1 420 300 A3 | 8/2005 |
| EP | 1 681 597 A | 7/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |
| WO | WO 2006/093340 A1 | 9/2006 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

European Search Report issued for European Patent Application No. 06253116.5, dated Oct. 24, 2006.

\* cited by examiner

LITHOGRAPHIC APPARATUS AND DEVICE MANUFACTURING METHOD

1. RELATED APPLICATIONS

This is non-provisional application claims benefit of and priority to U.S. Provisional Application No. 60/692,234, filed Jun. 21, 2005, the entire contents of which application is hereby incorporated by reference.

2. FIELD

The present invention relates to a lithographic apparatus and a method for manufacturing a device. In particular, the present invention relates to a lithographic apparatus comprising a liquid confinement system configured to confine liquid between a projection system and a substrate to be patterned by the projection system within the lithographic apparatus.

3. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
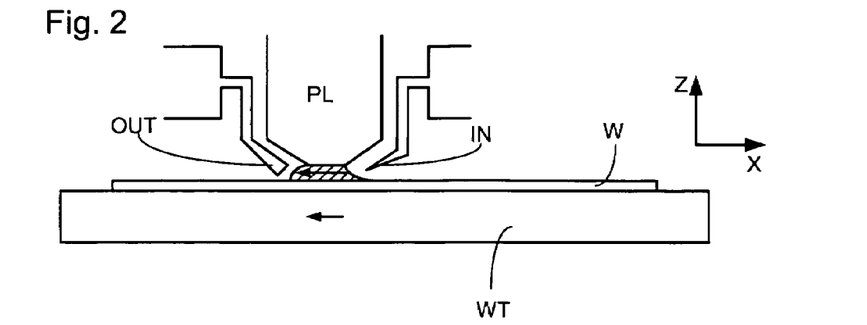
FIGS. 2 and 3 depict a liquid supply system used in a prior art lithographic projection apparatus.
Figure 3:
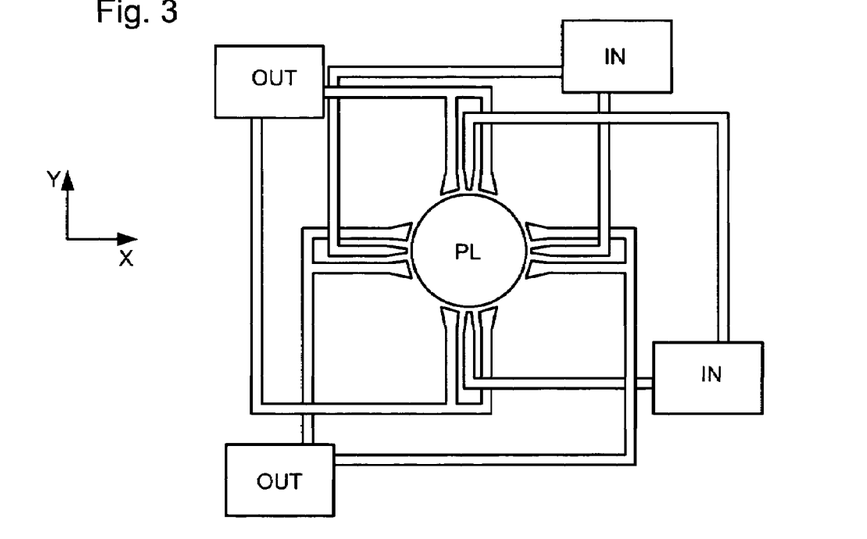

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

A problem with having a liquid in an immersion system as described above is that there is the risk of evaporation of the immersion liquid. The evaporation of the immersion liquid may have one or more consequences. A first is a possible problem of localized cooling of the substrate, resulting in the shrinkage of the substrate and thus overlay and focus errors from bimetallic bending caused by differences in the coefficient of thermal expansion between the substrate and the substrate table. Even if the substrate and the substrate table have the same coefficient of thermal expansion, a temperature gradient in the z-plane may cause bending and thereby possibly introduce focus errors. A second is the possible presence of drying stains on the substrate surface. A third consequence is the possible cooling of the liquid confinement system, which indirectly cools the projection system and may cause spherical aberrations in the projected beam. Furthermore, a temperature change caused by evaporation may cause the substrate table or the substrate holder sizes and shapes to change. The position stability and signals of the sensors on the substrate table may be prone to drifting if, for example, the substrate table changes shape. Finally, indirect cooling of the immersion liquid by the cooled liquid confinement system may result in refractive index variation in the liquid, which in turn may cause focus offsets and distortions in the projected beam and thus in the pattern.

The operation of the lithographic apparatus as a whole is state dependent and so any variation in energy in any of the parts of the system may lead to errors in the exposure of the resist layer on the substrate. The concentration difference in relative humidity just above a liquid film on the substrate, substrate table, substrate holder and sensors may cause the liquid in the liquid film to evaporate, causing one or more (or other) of the problems outlined above.

There are several places in the immersion system where evaporation of the immersion liquid may occur. These are:

1. between the liquid confinement system and the substrate;
2. on the surface of the substrate after wetting by the liquid confinement system;
3. in the exhaust channels inside the liquid confinement system; and/or
4. in a gutter or gap between the substrate holder and the substrate table containing the substrate holder.

Evaporation at these places may lead to temperature reduction and therefore may lead to energy loss in or at the projection system, the immersion fluid, the liquid confinement system, the sensors, the substrate, the substrate holder and the substrate table that contains the substrate holder and the substrate.

There are one or more reasons why net evaporation would be greater than net condensation, possibly causing a net loss of energy in the system. A first possible reason is the use of a gas knife, which is used to push the liquid film on the substrate back and drag it forward as the substrate moves in and out of the immersion system. The gas knife does this using a pressurized gas jet. Evaporation is a possible side effect of the movement of the liquid film. If liquid loss from the surface of the substrate is too large, the liquid film pushed by the gas knife is too large and the gas knife collapses. If this occurs, the liquid film evaporates outside the immersion system in the ambient environment.

A second possible reason is when the gas knife is not used or not completely effective, the substrate and substrate table are moved relative to the liquid confinement structure, so that a portion of the substrate and substrate table will be exposed to the atmosphere surrounding the lithographic apparatus. Any liquid remaining on the substrate or substrate table is likely to evaporate into the atmosphere, thus reducing the energy of the system. Evaporation of liquid from the liquid supply or exhaust system cools down the entire liquid confinement system, which cools down the immersion liquid, thus reducing the energy of the system and causing one or more (or other) of the problems described above.

4. SUMMARY

It is desirable to provide a system and method that efficiently and effectively eliminates the reduction of net energy in a liquid confinement system of a lithographic apparatus.

According to an aspect of the present invention, there is provided a lithographic apparatus configured to project a patterned radiation beam onto a target portion of a substrate held on a substrate holder of a substrate table, comprising:

a liquid supply system configured to at least partly fill a space between a projection system and the substrate table with liquid;

a liquid confinement structure arranged to at least partially contain the liquid within the space;

a substrate table displacement system arranged to move the substrate table along a path relative to the liquid confinement structure, thereby to move the target portion over the surface of the substrate;

a timetable comprising positions and timings of the substrate displacement system at which the substrate is likely to be undergoing localized cooling; and a liquid evaporation or condensation controller arranged to control the net rate of energy lost through evaporation or condensation of liquid supplied by the liquid supply system by synchronizing evaporation or condensation controlling techniques with the timetable.

According to an aspect of the invention, there is provided a device manufacturing method, comprising:

supplying a liquid to a space between a projection system of a lithographic apparatus and a substrate using a liquid supply system;

controlling a net rate of evaporation or condensation of liquid supplied by the liquid supply system by synchronizing evaporation or condensation with a timetable comprising positions and timings of the substrate at which the substrate is likely to be undergoing localized cooling; and projecting a patterned radiation beam through the liquid onto a target portion of the substrate.

According to an aspect of the invention, there is provided a device manufacturing method, comprising:

supplying a liquid to a space between a projection system of a lithographic apparatus and a substrate held by a substrate table, the liquid at least partially contained by a liquid confinement structure;

controlling the rate of energy lost through evaporation of the liquid;

heating a portion of the substrate according to (i) the position, (ii) velocity, (iii) acceleration, (iv) path, or (v) any combination of (i)-(iv) of the substrate table relative to the liquid confinement structure, the local substrate temperature or the local substrate table temperature; and switching simultaneously between heating and controlling the rate of energy lost.

Further aspects of the invention include condensation principles, adsorption principles and phase change material principles as methods of evaporation energy controlling techniques. Condensation principles control the amount of vapor available to condense on a surface—the greater the amount, the greater the heat energy is transferred to the surface on which the condensation occurs. Adsorption principles occur during the cooling down and heating up of materials—as a material cools down, gas is adsorbed into the material. Desorption of the gas occurs during unloading of the substrate so that in the subsequent substrate cycle, the absorption process may start again. During cooling, the state of a material changes, releasing energy. Regeneration of the phase change material is required during the unloading of a substrate, so that with the next substrate cycle, the process may start again.

5. BRIEF DESCRIPTION OF THE DRAWINGS

Embodiments of the invention will now be described, by way of example only, with reference to the accompanying schematic drawings in which corresponding reference symbols indicate corresponding parts, and in which.

6. DETAILED DESCRIPTION

Figure 1:
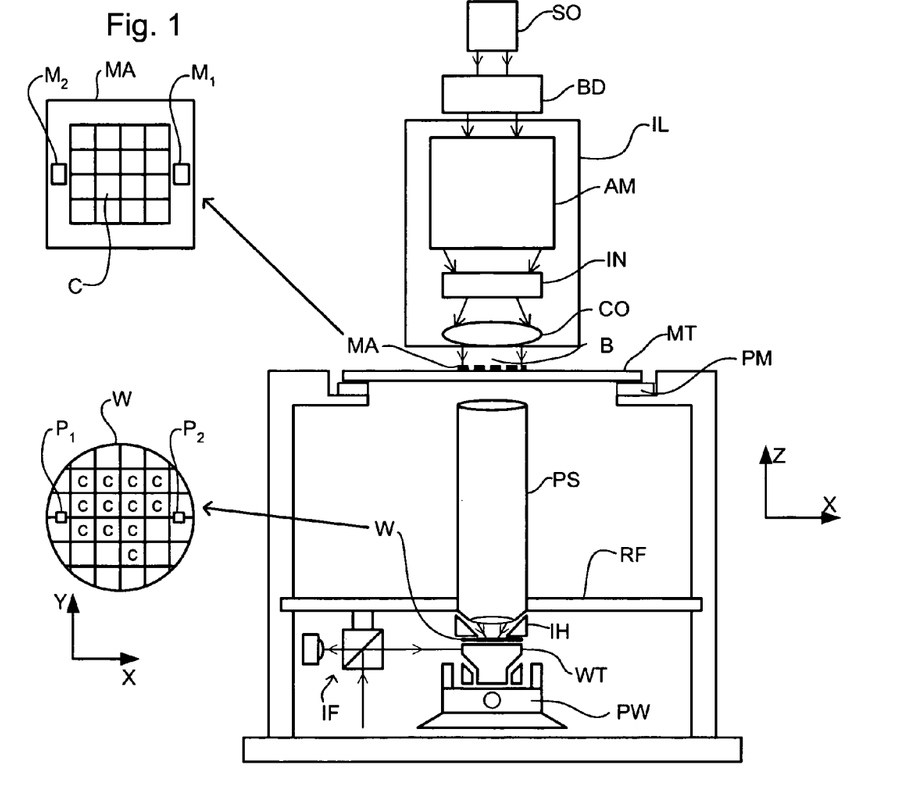
FIG. 1 depicts a lithographic apparatus according to an embodiment of the invention.

FIG. 1 schematically depicts a lithographic apparatus according to an embodiment of the invention. The apparatus comprises:
- an illumination system (illuminator) L configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
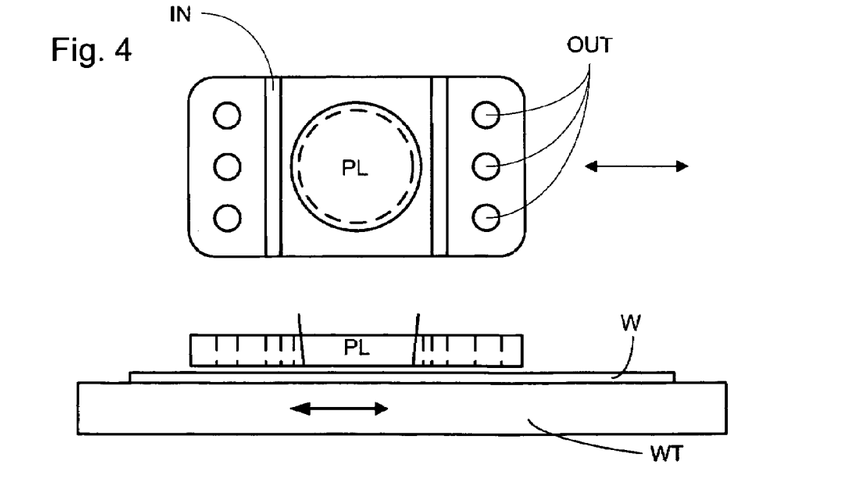
FIG. 4 depicts a liquid supply system according to another prior art lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. The seal may be a contactless seal such as a gas seal.

Figure 5:
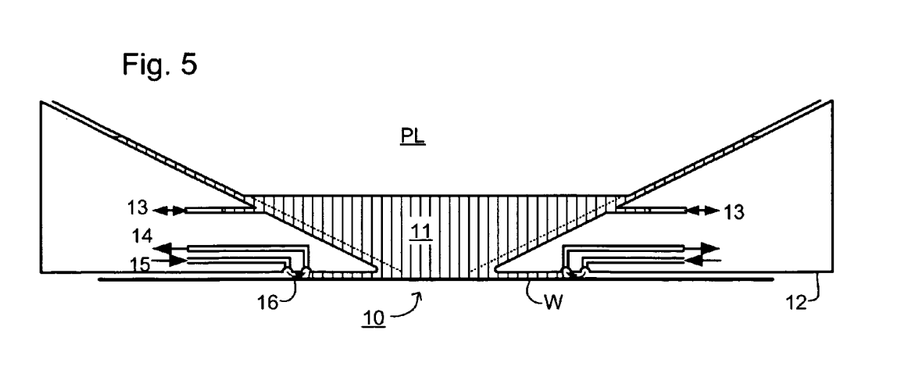
FIG. 5 depicts a liquid confinement system according to an embodiment of the present invention.

FIG. 5 shows an example of such a solution and depicts a liquid confinement system comprising a reservoir configured to hold immersion liquid of the immersion system according to an embodiment of the invention.

The reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular, though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid.

A gap also exists under the substrate W, between the bottom surface of the substrate W and the top surface of a substrate holder (also known as a burl plate or pimple plate) located in an indent in the substrate table WT. This gap may also comprise a gas seal of sorts to keep the bottom surface of the substrate W dry and free from the energy loss problems discussed herein.

A net energy loss is caused when more immersion liquid 11 evaporates than condenses. Localized energy fluctuations may cause distortion of the substrate or of the resist layer on the substrate. An embodiment of the present invention seeks to prevent localized energy fluctuations by reducing the evaporation rate, increasing the condensation rate, or both.

To compensate for this temperature reduction and energy loss when net evaporation is greater than net condensation, there are several possible solutions.

A first solution is to supply humidified compressed clean gas (e.g. air) to the immersion system, for example, via the gas knife, in order to reduce the parasitic evaporation of the immersion liquid by reducing the difference in relative humidity of the atmosphere inside the immersion system and the gas in the gas knife. Overlay errors and other problems linked to the presence of an immersion liquid and liquid confinement structure 12 may be tackled by a liquid evaporation controller, which targets and controls the rate of evaporation of immersion liquid in the region of the substrate. Molecules of liquid absorb energy from the surroundings in order to evaporate and, particularly if pumped away, the cooling that results can result in significant and non-uniform variations in the temperature of critical components such as the substrate. Thermally-induced distortions can lead to errors in the image finally exposed to the substrate. For example, evaporation of immersion liquid left behind on the substrate after the liquid confinement structure 12 has passed by can cause local temperature drops of up to 3 degrees K. As a result of this, at least a 20 nm single machine overlay error may typically result. However, this solution has a possible drawback of not being terribly efficient because the required over-pressure of the gas in the liquid confinement system for the gas knife means that 100% relative humidity may not be achieved after the expansion of the compressed gas. This is why evaporation nonetheless may occurs with this solution.

A second solution is thermal conditioning (i.e. supplying energy to the substrate table to reduce net energy loss) of the substrate W with a liquid flow to the substrate holder WH and/or the substrate table WT. The intention of this is to supply the evaporation energy with as small a temperature change as possible compared to a idle system and thereby slow down the evaporation rate of the immersion liquid, reducing thermal impact through, for example, thermo-mechanical deformations. The substrate table should remain at the system reference temperature. The same problems occur with this solution in that the whole substrate is cooled down and localized temperature fluctuations may not be inhibited.

A third solution in which errors caused by the cooling effects of evaporating immersion liquid are tackled is to provide a substrate heater configured to heat a portion of the substrate W according to the position, velocity, acceleration and/or path of the substrate table WT relative to the liquid confinement structure or the local substrate and/or substrate table temperature. Other parameters on which the heater characteristics may be dependent are the resist characteristics—in particular, the contact angle of radiation on the resist and the substrate used for the resist. The substrate heater may provide heating via one or more of a number of mechanisms. These may include one or more of the following: an infra-red emission source, a glow wire electrical resistance heater and a hot gas jet. Important factors when deciding which kind of heater to use include how finely and quickly the heating power needs to be adjusted, as well as how effectively the heater can be produced in miniature form. The latter factor will become more or less important depending on whether the heater needs to be embedded in or near the material whose temperature it is intended to regulate (such as a glow wire, for example, embedded in the substrate holder and/or substrate table) or whether the heater works to some extent at a distance (such as a radiation-emitting source or temperature-controlled gas jet source). In the case of a radiation-emitting source, the wavelength distribution of the radiation should be chosen so as not to react with resist compositions on the substrate (infra-red radiation would be safe in this regard for most resists of interest). Selection of radiation intensity will depend on the optical properties of the resist (such as its reflectivity). The heating system should be tuned for a process or have an adequate temperature sensing mechanism. There are likely advantages and disadvantages with both—tuning may require a less complex design, whereas temperature sensing may give a greater system availability than tuning.

Figure 6:
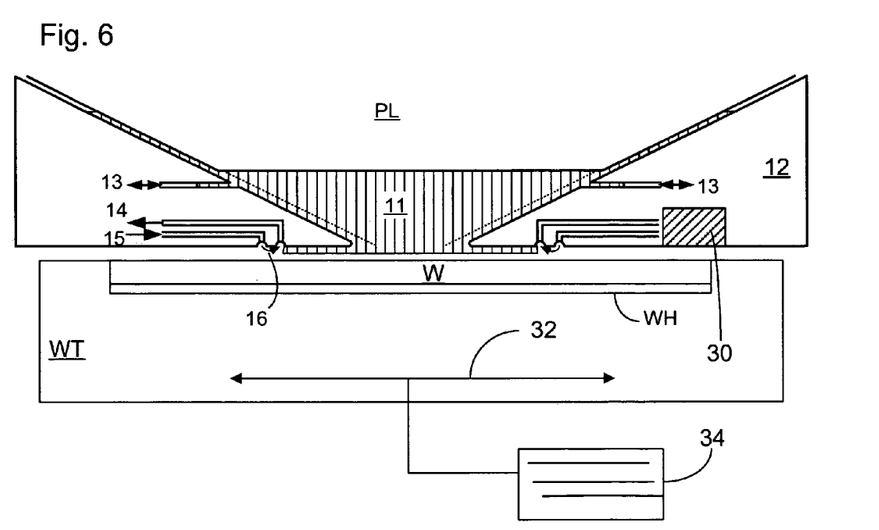
FIG. 6 depicts a liquid evaporation controlling system according to a first embodiment of the invention.

As discussed above, one of the reasons more liquid may evaporate than condense is that it is exposed to atmospheric conditions, for example, on the top surface of the substrate W or of the substrate table WT. FIG. 6 shows the substrate table WT with respect to the liquid confinement structure 12 and arrow 32 shows the direction in which the substrate table WT travels; i.e. laterally with respect to the liquid confinement structure 12. In order to know at what locations evaporation is most likely to occur, in an embodiment, a timetable 34 is created which comprises the position, velocity, acceleration and/or path of the substrate table WT with respect to the liquid confinement structure 12 relative to various points in time. Liquid evaporation controller 30 may be used in conjunction with timetable 34. The liquid evaporation controller 30 may take several forms, as long as the net energy extraction due to evaporation is controlled (rather than the evaporation itself being controlled). For example, it may heat the gas 16 which is supplied via inlet 15 and removed by outlet 14 such that the such that thermal equilibrium of the system remains constant, even as the substrate moves out from underneath the liquid confinement structure. Alternatively, the evaporation controller 30 may supply compressed humidified gas 16 via the inlet 15 and outlet 14. In an embodiment, the gas may be any suitable gas, such as air and/or nitrogen (nitrogen may be particularly useful when a liquid is used in the immersion system that cannot be exposed to air). This reduces the evaporation from the top surface of substrate W, thus equilibrating evaporation and condensation and thereby creating an energy equilibrium in the immersion system. With humidified gas, it is the evaporation that is suppressed, rather than the transfer of heat energy from the substrate to the gas.

Figure 7:
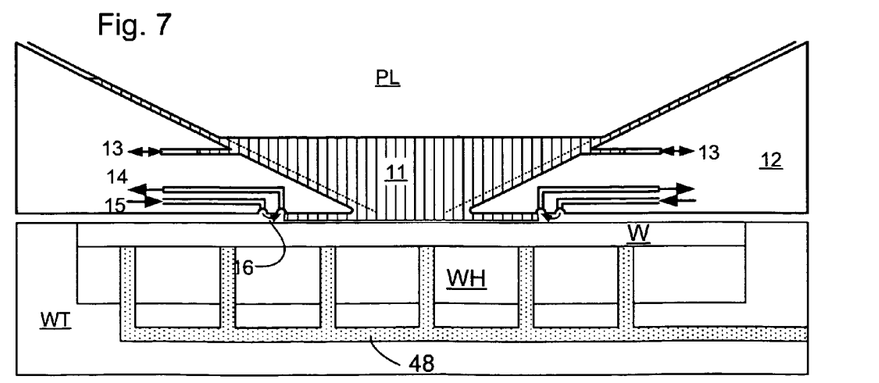
FIG. 7 depicts a liquid evaporation controlling system according to a second embodiment of the invention.

An alternative or additional evaporation controller is shown in FIG. 7. In this embodiment, humidified or heated gas 16 may still be introduced via the liquid confinement structure 12. Additionally or alternatively, a temperature conditioned liquid flow is supplied to the substrate holder. This lowers the temperature below the substrate W in the substrate table WT, thus increasing the rate of condensation at cool spots on the bottom surface of the substrate W because most vapor condenses to liquid when it is cooled down. The energy from the vapor is then transferred to the substrate (and other surfaces) on which the liquid has condensed. This increase in condensation on the bottom of the substrate and decrease in evaporation on the top of the substrate may be finely balanced in order to ensure that the substrate substantially maintains its thermal equilibrium, even when it has been moved out of range of protection of the liquid confinement structure 12.

A stable reference temperature is readily achieved by introducing a heat pipe 48 in the substrate holder WH, below the substrate W. Liquid (e.g., water) flowing through the heat pipe 48 may be conditioned using a temperature and/or pressure sensor and a heater, maintaining a substantially constant temperature in the pipe. Liquid vapor coming from the liquid in the heat pipe 48 will only condense at cold spots in the substrate table, transferring the latent heat from the vapor to the cold spot. No complex control mechanism is therefore required and a temperature overshoot is unlikely. A pressure sensor may be used to ensure that the pressure of, for example, the liquid vapor is not too high. The pressure of the liquid vapor should be controlled, in an embodiment where the liquid is water, to a tolerance of better than 4 Pa for a condensation temperature stability of 20 mK.

Any gas, or other fluids other than the working fluid, in the heat pipe 48 should be pumped out before the system is closed in order to optimize the heat transfer from the liquid and liquid vapor to the cold spots in the substrate holder. The heater that heats the liquid can be placed directly in the liquid or under the substrate table, thereby keeping the bottom part of the substrate table heated to a stable temperature, which in turn keeps the enclosed liquid at a stable temperature.

To avoid splashing of the liquid, a sponge-like material can be placed in liquid grooves in the substrate table WT, around the substrate holder WH. The sponge-like material is also placed such that it removes the liquid from the condensation areas in order to make those locations available for further vapor to condense.

Furthermore, the heat pipe 48 can be made up of several channels and these channels can be positioned as close to the surface of the substrate holder WH as possible so that the temperature of the liquid in the channels affects the temperature of the substrate W most directly. There can be hollow pimples or dimples in the substrate holder WH, below the substrate, and these pimples or dimples can contain passages that allow liquid vapor to pass through to the underside of the substrate and condense directly onto the cold spots of the substrate, rather than just at the cold spots of the substrate holder. In this way, the heat transfer is more direct and the time taken to transfer the heat is reduced, reducing the chance of temperature fluctuations.

Humidified gas (e.g., humidified air) that is introduced to the top surface of the substrate is prone to expansion after the gas knife has passed over the substrate. This causes a relative humidity of less than 100%. In the area between the gas knife and a gas knife extraction conduit, the humidified gas cools down and its humidity increases again because colder gas has a lower humidity capacity than warm gas. Warm, humidified gas may therefore be supplied after the gas knife. In an embodiment, for a drop of 0.4 bar during the passing of the gas knife, water saturated air at approximately 28° C. may be used in order to give post-gas knife air at 22° C. with 100% relative humidity. Evaporated liquid in the warm gas is condensed out again after expansion to leave a null energy result on the substrate.

Figure 8:
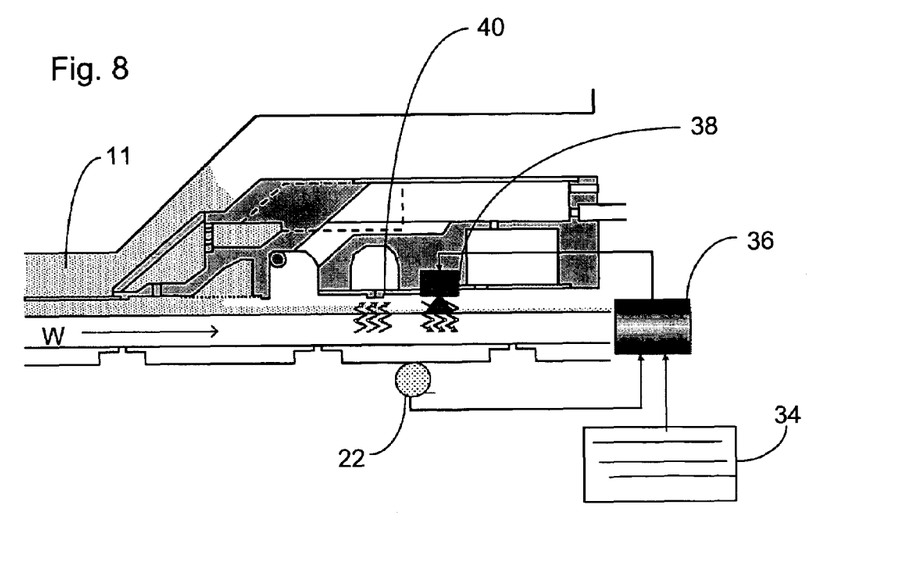
FIG. 8 depicts an energy regulating system according to a third embodiment of the invention.

FIG. 8 shows an alternative or additional embodiment that may be used to compensate for evaporation from the top of the substrate W. As the substrate W moves towards the right, in the direction of the arrow, the upper surface of the substrate W, which has been in contact with the immersion liquid 11, undergoes drying by a gas knife 40. The gas knife supplies a wedge of gas (e.g., air) to the surface of the substrate in order to remove the final thin film of immersion liquid 11 remaining on the substrate after the liquid confinement structure 12 has been removed. This is a common time at which the substrate will cool down and thereby lose energy. The typical loss of local cooling power caused by the gas knife is of the order of 20 Watts on hydrophilic surfaces (e.g. at a 60° contact angle) when using air.

There are one or more ways to compensate for this evaporation energy loss using the gas knife. A first is to supply high pressure humidified gas (e.g., air) via the gas knife. Another is to heat the gas (e.g., air) in the gas knife, for example using a radiation source 38 such as an LED or a microwave cavity with one or more conditioning tubes.

The embodiment shown in FIG. 8 has a temperature sensor 22 which inputs information into a controller (such as a CPU) 36, along with timetable information 34. When the substrate W is most likely to be losing energy through evaporation caused by the gas knife 40, the CPU 36 controls the radiation source 38 in order to increase the local surface temperature of the substrate W at that point that it is likely to be losing energy, thereby reestablishing the thermal equilibrium.

The wavelength range of the radiation source must be chosen so that it does not expose the resist on the surface of the substrate, and so that the light is absorbed by the same amount on all process layers. Multiple radiation sources may be arranged over the periphery of the gas knife so that the section of the substrate where an "evaporation trail" is left behind may be compensated for effectively. Further information that may be put into the timetable (which may also be known as a fast forward table) may be job layout data, scan speed and/or resist characteristics. The information supplied by the controller to the radiation source may also steer the direction in which the radiation source transmits its radiation in order to more finely control the surface temperature of the substrate.

Figure 9:
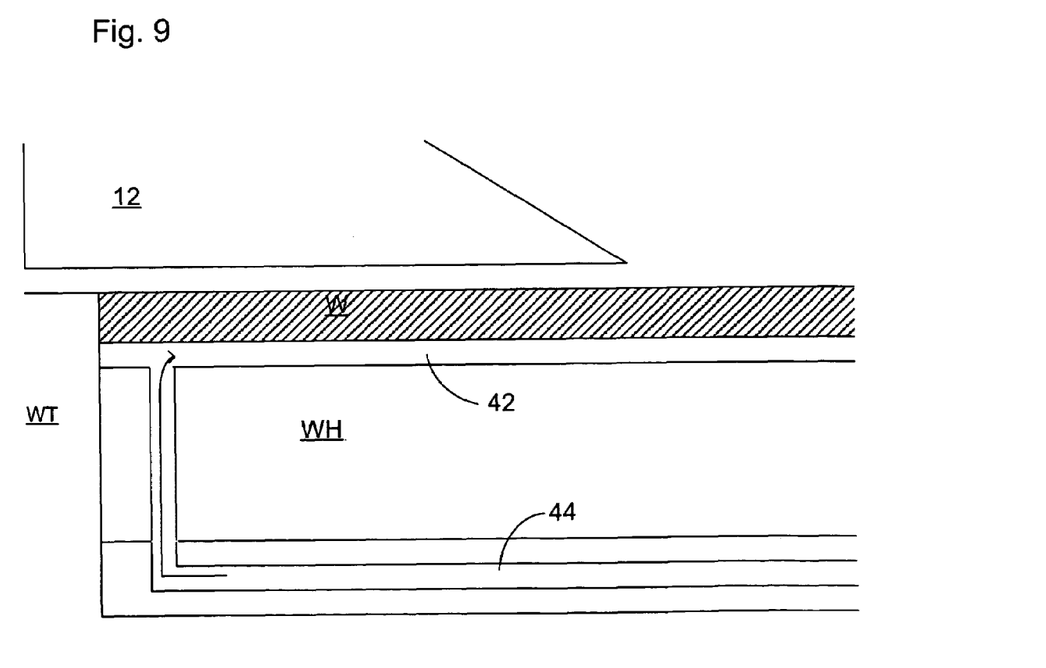
FIG. 9 depicts an energy regulating system according to a fourth embodiment of the invention.

FIG. 9 shows another or alternative embodiment for increasing condensation to the bottom of the substrate, thereby restoring thermal equilibrium in a different manner from heating the top. The embodiments may, of course, be combined to enhance the precision of the thermal equilibrium.

Supplying liquid saturated gas 44 (e.g. saturated ethanol at approximately 24 mbar or 60 mbar) in the vacuum 42 between the substrate W and the substrate holder WH will lead to condensation of liquid (e.g., water) at the cold spots of the substrate W. The energy loss by condensation will heat the substrate gas temperature. As long as saturated gas 44 is supplied, the condensed liquid under the substrate W will not evaporate. To compensate for average energy losses at the top surface of the substrate W, only a few micron thick liquid film is required to condense on the bottom surface of the substrate W.

The liquid on the under side of the substrate W is subsequently removed by a supply of dry gas after the last exposure of the substrate, before the substrate is unloaded. Liquid (e.g., water) evaporation under pressure is very quick. The advantage of this method of energy regulation is that the energy can be supplied at the exact location of the substrate W where energy loss is occurring without any active control. This is because the liquid will condense at the coldest parts of the substrate W. An additional advantage is that a temperature overshoot is not possible. This is because only the heat capacity of the substrate W participates in the transient behavior of the liquid and thus energy regulation is carried out in the shortest possible time. In other words, as the substrate cools down through energy losses on its top surface, liquid condenses on its bottom surface, thus transferring energy back in as quickly as it escapes.

Figure 10:
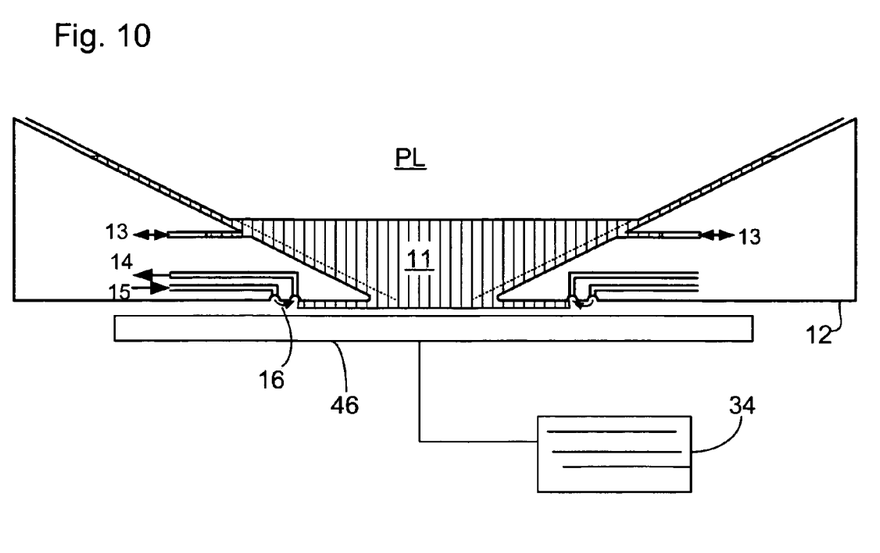
FIG. 10 depicts an energy regulating system according to a fifth embodiment of the invention.

FIG. 10 shows a closing plate 46 supplying the bottom surface of the liquid confinement structure 12, for example, while a substrate is being swapped. The position, speed, acceleration and timing of the closing plate may also be added into the information in the timetable 34. Conditioning the closing plate allows the immersion liquid to be more easily maintained at the same temperature/energy.

Figure 11:
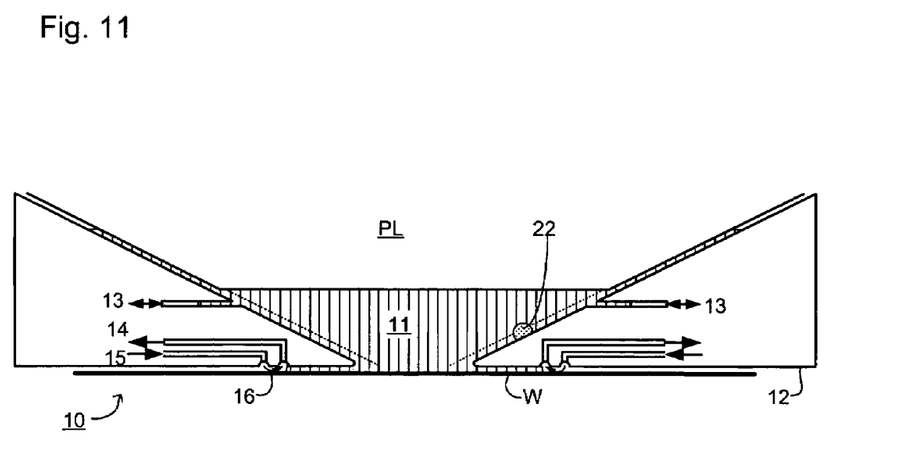
FIG. 11 depicts a temperature sensor according to a sixth embodiment of the invention.
Figure 12:
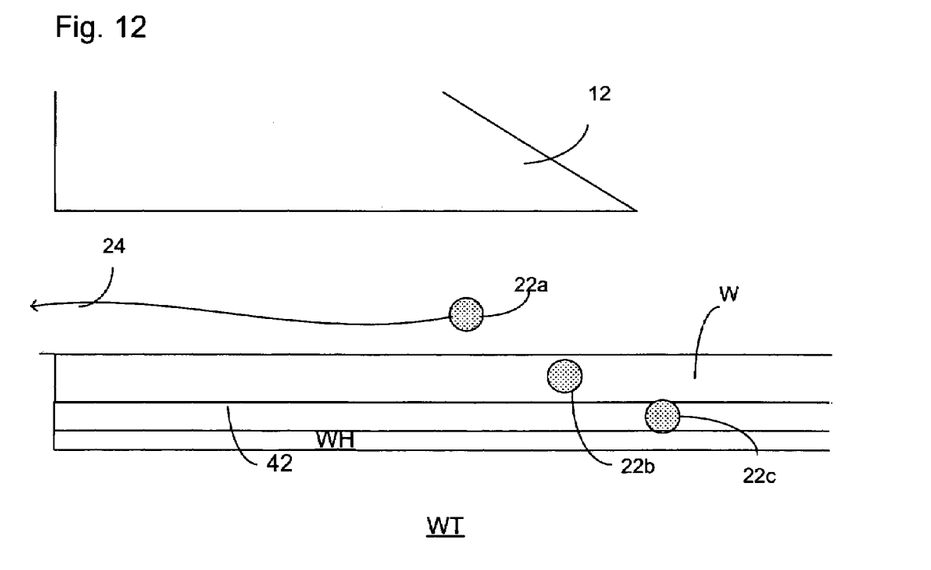
FIG. 12 depicts alternative positions for a temperature sensor according to further embodiments of the invention.

In an alternative or additional embodiment of the present invention, evaporation control methods are actively applied when a reduction in temperature of the substrate is detected. Changes in temperature may be detected in the immersion liquid itself with a detector 22 as shown in FIG. 11; or the temperature sensor may be in different positions around the substrate W itself, such as in one or more of the positions shown in FIG. 12. Temperature sensor 22a hovers above the substrate W and FIG. 12 shows a lead 24 connecting the temperature sensor to a CPU, such as that shown in FIG. 8 (CPU 36). Temperature sensor 22b is inside the substrate W and sensor 22C is in the vacuum 42 between the substrate W and the substrate holder WH. The scale of the vacuum 42 with respect to the substrate W and the substrate holder WH has been exaggerated for illustrative purposes. Sensors may also be placed in the liquid supply system. Temperature sensors may be positioned in one or a plurality of these positions in order to sense the temperature of the substrate in different places, depending on the likely cause of the loss of energy at that position. A sensor may further be placed in the substrate table itself, though it would be sensible to have it in a position such as that shown in FIG. 12 and labeled as 22c so that it is as close to the surface of the substrate table and/or the surface of the substrate W as possible because it is the substrate that may suffer if the thermal equilibrium of the substrate is lost.

A heating element may be simultaneously switched with the use of humidified compressed clean gas (e.g., air), for example, as described with respect to FIG. 6. In this way, the evaporation process is compensated over time by the energy dissipation of the heater without the need of a temperature control system. Evaporation of the liquid film on the substrate takes place when the liquid confinement system moves (e.g., 25 W energy loss when the substrate is moving compared to a 5 W energy loss when it is standing still in a system using liquid and air). The rate of movement affects the rate of the energy loss. The liquid film is left on the substrate behind the gas knife, rather than in front and so the information on the movement pattern and speed of the substrate with respect to the immersion system is used to switch both the power of the compensation and the location of the substrate with respect to the liquid confinement system in the immersion system. Resist parameters (e.g. wettability by the immersion liquid) and gas knife gas parameters (e.g. Marangoni effect) determine the required heating power.

When using a passive system, such as that described with respect to FIG. 9, with no temperature sensor 22, there is no control loop and so very few electronics are required. It is therefore easy to adapt existing machines if required, although new machines may of course be built with integrated temperature compensation systems.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A lithographic apparatus configured to project a patterned radiation beam onto a target portion of a substrate held on a substrate holder of a substrate table, comprising:
   a liquid supply system configured to at least partly fill a space between a projection system and the substrate table with liquid;
   a liquid confinement structure arranged to at least partially contain the liquid within the space;
   a substrate table displacement system arranged to move the substrate table along a path relative to the liquid confinement structure, thereby to move the target portion over the surface of the substrate;
   a timetable comprising positions and timings of the substrate displacement system at which the substrate is likely to be undergoing localized cooling; and
   a liquid evaporation or condensation controller arranged to control the net rate of energy lost through evaporation or condensation of liquid supplied by the liquid supply system by synchronizing evaporation or condensation controlling techniques with the timetable.

2. The apparatus according to claim 1, wherein the evaporation controller comprises a substrate heater configured to heat a portion of the substrate according to the (i) position, (ii) velocity, (iii) acceleration, (iv) path, or (v) any combination of (i)-(iv) of the substrate table relative to the liquid confinement structure, the local substrate temperature, or the local substrate table temperature.

3. The apparatus according to claim 1, wherein the evaporation controller comprises a substrate table heater configured to heat a portion of the substrate table according to the (i) position, (ii) velocity, (iii) acceleration, (iv) path, or (v) any combination of (i)-(iv) of the substrate table relative to the liquid confinement structure, the local substrate temperature, or the local substrate table temperature.

4. The apparatus according to claim 1, wherein the evaporation controller is configured to thermally condition the substrate using a liquid flow to the substrate table.

5. The apparatus according to claim 1, wherein the evaporation controller is configured to thermally condition the substrate table using a liquid flow to the substrate table.

6. The apparatus according to claim 1, wherein the evaporation controller is configured to control a temperature of the substrate table by the incorporation of a volume containing liquid and vapor in the substrate holder.

7. The apparatus according to claim 6, wherein the volume is a pipe.

8. The apparatus according to claim 6, wherein the liquid is water and the vapor is water vapor.

9. The apparatus according to claim 6, wherein the liquid is a hydrocarbon containing refrigerant and the vapor is a hydrocarbon vapor.

10. The apparatus according to claim 6, wherein the liquid is R134a, 1,1,1,2-tetrafluoroetane.

11. The apparatus according to claim 6, wherein the liquid is a mixture of hydrocarbon containing refrigerants and the vapor is a mixture of hydrocarbon vapors.

12. The apparatus according to claim 11, wherein the liquid is R401a.

13. The apparatus according to claim 6, wherein the liquid is ammonia and the vapor is ammonia vapor.

14. The apparatus according to claim 6, comprising a heater configured to heat the liquid.

15. The apparatus according to claim 14, wherein the heater is configured to be located in the liquid.

16. The apparatus according to claim 14, wherein the heater is positioned below the substrate table.

17. The apparatus according to claim 14, further comprising a temperature and/or pressure sensor to provide an input parameter for the heater.

18. The apparatus according to claim 6, wherein the volume is empty of gas and non-condensable fluids, and is sealed from the atmosphere.

19. The apparatus according to claim 6, wherein the volume comprises a plurality of channels, which are as close to a substrate holder surface configured to face the substrate as possible.

20. The apparatus according to claim 6, comprising hollow dimples in a surface of the substrate holder configured to face the substrate.

21. The apparatus according to claim 20, wherein the hollow dimples comprise passages between the volume and the substrate such that they allow vapor to pass from the volume to a bottom surface of the substrate.

22. The apparatus according to claim 6, further comprising a sponge-like material in the substrate table.

23. The apparatus according to claim 1, further comprising a gas knife configured to supply a stream of gas to the substrate surface between projections by the projection system, wherein the evaporation controlling technique comprises supplying compressed humidified gas in the gas knife.

24. The apparatus according to claim 1, wherein the evaporation controlling technique comprises supplying compressed humidified gas into the liquid confinement system.

25. The apparatus according to claim 1, further comprising a gas knife configured to supply a stream of gas to the substrate surface between projections by the projection system, wherein the evaporation controlling technique comprises heating of the gas in the gas knife.

26. The apparatus according to claim 25, configured to heat the gas in the gas knife using a light emitting diode.

27. The apparatus according to claim 25, configured to supply warm humidified gas to an area between the gas knife and a gas knife extraction conduit.

28. The apparatus according to claim 27, further comprising a condensation separator configured to separate condensation from the warm humidified gas upstream of the liquid confinement structure.

29. The apparatus according to claim 1, configured to have a vacuum between the substrate holder and the substrate and to supply liquid-saturated gas into the vacuum.

30. The apparatus according to claim 1, wherein the timetable comprises times when the substrate is likely to be cooled and therefore when evaporation of liquid from the substrate is likely to occur.

31. The apparatus according to claim 30, wherein the timetable further comprises evaporation power and location on the substrate table or substrate as a function of time.

32. The apparatus according to claim 30, further comprising a gas knife configured to supply a stream of gas to the substrate surface between projections by the projection system, wherein the timetable comprises times and positions of the gas knife over the substrate as a time the substrate is likely to be cooled.

33. The apparatus according to claim 30, wherein the timetable further comprises the sequence number of a present substrate in a sequence of substrates.

34. The apparatus according to claim 30, wherein the timetable further comprises input from a sensor comparing actual substrate timing with precalculated optimal timing.

35. The apparatus according to claim 30, wherein the timetable further comprises input regarding a parameter of the radiation irradiating the substrate.

36. The apparatus according to claim 30, further comprising a closing plate configured to keep the liquid within the liquid confinement structure when the liquid confinement structure is not over the substrate, wherein the timetable comprises the times when the closing plate is not containing the liquid as a time the substrate is likely to be cooled.

37. The apparatus according to claim 1, wherein the timetable comprises positions on the substrate where the substrate is likely to be cooled and therefore from where evaporation of liquid from the substrate is likely to occur.

38. The apparatus according to claim 37, wherein the timetable further comprises evaporation power and location on the substrate table or substrate as a function of time.

39. The apparatus according to claim 37, wherein the timetable comprises the relative position of the substrate with respect to the liquid confinement structure.

40. The apparatus according to claim 37, wherein the timetable comprises the position of the top surface of the substrate.

41. The apparatus according to claim 37, wherein the timetable comprises the position of the bottom surface of the substrate.

42. The apparatus according to claim 37, wherein the timetable comprises the position of an exhaust channel of the liquid confinement structure.

43. The apparatus according to claim 1, further comprising a desorption device configured to desorb gas from the substrate table that has been adsorbed during contact with the liquid supply system.

44. The apparatus according to claim 1, further comprising a regeneration device configured to return to its original phase any part of the substrate table that has changed phase during contact with the liquid supply system.

45. The apparatus according to claim 1, wherein the liquid evaporation controller comprises a temperature sensor.

46. The apparatus according to claim 45, wherein the temperature sensor is in the liquid confinement structure.

47. The apparatus according to claim 45, wherein the temperature sensor is configured to hover above the substrate.

48. The apparatus according to claim 45, wherein the temperature sensor is configured to be between the substrate and the substrate table.

49. The apparatus according to claim 45, wherein the temperature sensor is in the substrate table.

50. A device manufacturing method, comprising:
  supplying a liquid to a space between a projection system of a lithographic apparatus and a substrate using a liquid supply system;
  controlling a net rate of energy lost through evaporation or condensation of liquid supplied by the liquid supply system by synchronizing evaporation or condensation with a timetable comprising positions and timings of the substrate at which the substrate is likely to be undergoing localized cooling; and
  projecting a patterned radiation beam through the liquid onto a target portion of the substrate.

* * * * *